United States Patent [19]

Elsaesser et al.

[11] Patent Number: 4,840,867

[45] Date of Patent: Jun. 20, 1989

[54] POSITIVE-WORKING RADIATION-SENSITIVE RECORDING MATERIAL WITH RADIATION-SENSITIVE 1,2-QUINONE DIAZIDE UNDERLAYER AND THICKER POSITIVE-WORKING RADIATION-SENSITIVE OVERLAYER

[75] Inventors: Andreas Elsaesser, Idstein; Klaus Rode, Wiesbaden, both of Fed. Rep. of Germany

[73] Assignee: Hoechst Aktiengesellschaft, Frankfurt am Main, Fed. Rep. of Germany

[21] Appl. No.: 63,070

[22] Filed: Jun. 17, 1987

[30] Foreign Application Priority Data

Jun. 26, 1986 [DE] Fed. Rep. of Germany ....... 3621376

[51] Int. Cl.$^4$ ...................... G03C 1/495; G03C 1/54; G03C 1/74
[52] U.S. Cl. ...................................... 430/156; 430/270; 430/271; 430/302; 430/308; 430/309; 430/310; 430/330
[58] Field of Search .................... 430/156, 270, 271

[56] References Cited

U.S. PATENT DOCUMENTS

| | | | |
|---|---|---|---|
| 2,702,243 | 2/1955 | Schmidt | 430/156 |
| 3,313,626 | 4/1967 | Whitney | 430/156 |
| 3,765,894 | 10/1973 | Mellan | 430/156 |
| 3,779,778 | 12/1973 | Smith et al. | 96/115 R |
| 3,915,706 | 10/1975 | Limburg et al. | 96/27 R |
| 3,917,483 | 11/1975 | Limburg et al. | 96/27 R |
| 3,984,253 | 10/1976 | Nelson | 96/35.1 |
| 4,101,323 | 7/1978 | Buhr et al. | 96/35 |
| 4,180,604 | 12/1979 | Feng et al. | 430/156 |
| 4,191,573 | 3/1980 | Toyama et al. | 430/156 |
| 4,197,128 | 4/1980 | Watanabe et al. | 430/156 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,506,003 | 3/1985 | Ruckert et al. | 430/270 |
| 4,647,475 | 3/1987 | Inukai et al. | 430/156 |

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A radiation-sensitive recording material comprising a support and first and second radiation-sensitive layers is disclosed. The first radiation-sensitive layer comprises a 1,2-quinone diazide as the radiation-sensitive compound and the second radiation-sensitive layer comprises (a) a compound which forms a strong acid under the action of actinic radiation, (b) a compound which has at least one acid-cleavable C-O-C bond and (c) a polymeric binder. The recording material has an improved storage stability as compared with materials which comprise only radiation-sensitive layers based on acid-cleavable compounds.

12 Claims, No Drawings

POSITIVE-WORKING RADIATION-SENSITIVE RECORDING MATERIAL WITH RADIATION-SENSITIVE 1,2-QUINONE DIAZIDE UNDERLAYER AND THICKER POSITIVE-WORKING RADIATION-SENSITIVE OVERLAYER

BACKGROUND OF THE INVENTION

This invention relates to a positive-working radiation-sensitive recording material comprising a support and a radiation-sensitive layer that contains as the essential constituents (a) a compound which forms a strong acid under the action of actinic radiation, (b) a compound which has at least one acid-cleavable C—O—C bond, and (c) a polymeric binder. The material is, in particular, suitable for the production of printing plates and photoresists.

Such materials are known in the art and are described, for example, in U.S. Pat. Nos. 3,915,706, 3,917,483, 3,779,778 and 3,984,253, in German Offenlegungsschriften Nos. 26 10 842, 27 18 254 and 30 23 201 and in European Patent Applications Nos. 6626, 6627 and 22 571. They have a substantially higher light-sensitivity than the customary positive-working radiation-sensitive recording materials based on 1,2-quinone diazides. However, it is a disadvantage of these recording materials that they do not have a satisfactory storage stability when they are used with support materials, for example, aluminum, copper, steel, zinc, brass, chromium and plastic sheets that are customarily employed in photolithographic and reprographic applications. Storage stability is, in particular, unsatisfactory when the support materials have been pretreated with acidic or alkaline agents, as are generally and preferably employed to improve the adhesion of the radiation-sensitive layers. The same applies when reaction products of an acidic or basic nature have formed on the surfaces of the support materials, by the action of air and/or moisture.

SUMMARY OF THE INVENTION

Therefore, it is an object of the present invention to improve the storage stability of positive-working radiation sensitive recording materials based on acid-cleavable compounds.

It is a further object of the present invention to improve the storage stability of recording materials based on acid cleavable compounds which are coated on an alkaline or acidic surface.

The invention provides a radiation-sensitive recording material comprising a support and a radiation-sensitive layer that contains as the essential constituents (a) a compound which forms a strong acid under the action of actinic radiation, (b) a compound which has at least one acid-cleavable C—O—C bond and (c) a polymeric binder.

Underneath the radiation-sensitive layer an additional radiation-sensitive layer comprising a 1,2-quinone diazide as the radiation-sensitive compound, is present on the support.

DESCRIPTION OF THE PREFERRED EMBODIMENTS

Within the scope of the present invention, the term "radiation-sensitive" refers to any system that is sensitive to electromagnetic radiation in a general sense, i.e., to infrared, visible and ultraviolet light and to high-energy radiation, such as X-rays, electron beams and other corpuscular radiation. The systems are preferably sensitive in the shortwave visible or near to medium ultraviolet region. It is, however, also possible for the compound which forms the strong acid by radiation to be resistant to light, e.g., daylight, and sensitive to electron beams and X-rays. Even laser radiation may optionally be used to generate an image.

The thickness of the intermediate layer comprising the quinone diazide should, in general, be less than the thickness of the outer layer based on acid-cleavable compounds. If the quinone diazide layer is thicker than the outer layer, the advantage of higher light-sensitivity as compared to materials which exclusively comprise layers based on quinone diazides is usually lost. The lower limit of thickness of the quinone diazide layer is determined chiefly by the coating technique. In principle, the layer may be as thin as desired, provided it still forms a continuous layer without any substantial voids. In most cases, layer thicknesses ranging from about 10 to 5,000 nm, preferably from about 20 to 5,000 nm yield good results. For printing plates and relatively thin high-resolution photoresist layers, layer thicknesses of about 40 to 500 nm are preferred. In the case of thick photoresist layers of about 0.01 to 0.05 mm the intermediate layer may also be considerably thicker than 500 nm, without thereby substantially impairing light-sensitivity as a whole. The optimum value chosen for the thickness of the intermediate layer depends on a variety of factors, for example, on the type and treatment of the support material, the composition of the intermediate layer or the structure of the o-quinone diazide compound used.

In those cases in which high light-sensitivity is of minor interest, but it is intended to improve other properties (for example, the resistance to strongly alkaline developers) the thickness of the intermediate layer appropriately has relatively higher values.

As the o-quinone diazide compound any compound of this structural type can basically be used in the intermediate layer. However, the stabilizing action of the o-quinone diazide layer on the layer containing compounds with acid-cleavable C—O—C bonds may depend on the nature of the substituents. The preferably used compounds comprise 1,2-naphthoquinone-2-diaiide-4- or 1,2-naphthoquinone-2-diazde-5-sulfonic acid esters or amides. Particularly preferred are the esters, in particular the esters of 5-sulfonic acids. Suitable compounds of this type are known in the art and are described, for example, in German Patent No. 938 233 and in German Offenlegungsschriften Nos. 21 31 377, 25 47 905 and No. 28 28 017.

Polymeric, water-insoluble binders which are soluble in organic solvents and also soluble or at least swellable in aqueous-alkaline solutions are preferably added to the intermediate layer to improve its filmforming properties. Examples of such binders include: phenol-formaldehyde resins or cresol-formaldehyde resins, particularly novolaks, which may be modified in a known manner by reaction with epoxides, isocyanates etc. Polymers of vinyl phenol or isopropenyl phenol and copolymers of these compounds with alkyl acrylates, alkyl methacrylates or styrene etc, as described, for example, in German Offenlegungsschrift No. 34 06 927, are also suitable. The amount of binder used may be varied within wide limits; however, proportions of binder ranging from about 30 to 90 percent by weight, in particular from about 55 to 85 percent by weight, are preferred. The amount of o-quinone diazide compounds generally ranges from about 3 to 50 percent by weight, preferably from about 7 to 35 percent by weight, based on the nonvolatile constituents of the layer.

To meet special requirements, additives may be included in the layers. Such additives comprise, for example, plasticizers, e.g., polyvinyl ether, as described in German Offenlegungsschrift No. 16 22 301, or hydrogenated colophony resin, as described in German Offenlegungsschrift No. 30 23 201, and also adhesion promoters, pigments, dyes, color precursors and optionally UV absorbers. The particularly preferred dyes comprise the carbinols of triphenylmethane dyes.

For coating the support material, the layer constituents are usually dissolved in a solvent. The choice of the solvent is matched to the coating process, the layer thickness and the drying conditions. Basically, any solvents which are compatible with the layer constituents are suitable, for example, alcohols, ketones, esters, chlorinated hydrocarbons etc. Preferred mixtures contain glycol ethers.

The customary equipment and conditions may be employed for drying the intermediate layer. In general, a drying temperature of 100° C. is sufficient.

The actual, highly light-sensitive layer based on acid-cleavable compounds is applied on top of the intermediate stabilizing layer. Representatives of suitable acid-cleavable compounds are primarily:

(A) those with at least one orthocarboxylic acid ester and/or carboxylic acid amide acetal grouping, it being possible for the compounds also to have polymeric character and for the groupings mentioned to appear as linking elements in the main chain or as lateral substituents, (B) oligomer or polymer compounds having recurrent acetal and/or ketal groupings in the main chain, and (C) compounds having at least one enolic ether or N-acyl-iminocarbonate grouping.

Acid-cleavable compounds of type (A) as components of radiation-sensitive mixtures are described in detail in European Patent Application No. 0 022 571; mixtures that contain compounds of type (B) are described in German Patents No. 23 06 248 and No. 27 18 254; and compounds of type (C) are described in European Patent Applications No. 0 006 626 and No. 0 006 627.

The amount of cleavable compound can be varied from about 5 to 70 percent by weight, the preferred range being from about 5 to 40 percent by weight.

The outer radiation-sensitive layer also contains a polymeric, preferably water-insoluble binder which is soluble in organic solvents. Since aqueous-alkaline solutions advantageously can be employed as developer liquids for the exposed layers and these are in general preferred to developers based on organic solvents, binders which are soluble, or at least swellable, in aqueous alkaline solutions are particularly preferred.

The nature and quantity of the water-insoluble binders can differ depending on the intended application; the proportions in total solids are preferably from about 30 to 90 percent by weight, particularly from about 55 to 85 percent by weight.

The phenolic resins proven in many positive-working recording materials, especially novolaks, have also proven particularly useful and advantageous in the materials according to the invention. They promote the strong differentiation between the exposed and unexposed parts of the layer on development, particularly the relatively highly condensed resins containing substituted phenols, for example, cresols, as the formaldehyde condensation partners. The novolaks can also be modified in a known manner by reacting a part of their hydroxyl groups with, for example, chloroacetic acid, isocyanates, epoxides or carboxylic acid anhydrides. Other alkali-soluble resins, such as copolymers of maleic anhydride and styrene, vinyl acetate and crotonic acid, methyl methacrylate and methacrylic acid, and the polymers described as constituents of the quinone diazide layer are also suitable as binders.

Additionally, numerous other resins can also be used. These can be either water-soluble or alkali-insoluble and are preferably vinyl polymers, such as polyvinyl acetates, polyacrylates, polyvinyl ethers and polyvinyl pyrrolidones, which in turn can be modified by comonomers. The most favorable proportion of these resins depends on the requirements of the application and on the influence on the development conditions, and in general is not more than 20 percent relative to the alkali-soluble resin. For special requirements, such as flexibility, adhesion, gloss and the like, the radiation-sensitive layer can additionally contain small amounts of other substances, such as polyglycols, cellulose ethers (e.g., ethylcellulose), wetting agents, dyes and finely divided pigments.

Suitable radiation-sensitive components that on irradiation preferably form or eliminate strong acids comprise a large group of known compounds and mixtures, such as diazonium, phosphonium, sulfonium and iodonium salts; halogen compounds; o-quinonediazidesulfochlorides and organometal-organohalogen combinations. The aforementioned diazonium, phosphonium, sulfonium and iodonium compounds are generally used in the form of their salts which are soluble in organic solvents, usually as deposition products with complex acids such as hydroborofluoric acid, hexafluorophosphoric, hexafluoroantimonic and hexafluoroarsenic acid.

In principle, the halogen-containing, radiation-sensitive compounds that form halohydric acid can be any organic halogen compound also known as a photochemical free-radical initiator, for example, those compounds having more than one halogen atom on a carbon atom or on an aromatic ring. Examples are described in U.S. Pats. Nos. 3,515,552, 3,536,489 and 3,779,778, in German Patent No. 26 10 842 and in German Offenlegungsschriften Nos. 22 43 621, 27 18 259 and 33 37 024. Preferred compounds are the s-triazine derivatives having two halogenomethyl groups, especially trichloromethyl groups, and an aromatic or unsaturated substituent in the triazine nucleus. These compounds are described in German Offenlegungsschriften Nos. 27 18 259 and 33 37 024. The action of these halogen-containing compounds can also be spectrally affected and enhanced by known sensitizers.

Examples of suitable initiators are: 4-(di-n-propylamino)-benzenediazonium tetrafluoroborate, 4-p-tolylmercapto-2,5-diethoxybenzenediazonium hexafluorophosphate and tetrafluoroborate, diphenylamine- 4-diazonium sulfate, 4-methyl-6-trichlormethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethyl-quinoline, 2,4-dimethyl-1-tribromoacetylbenzene, 3-nitro-1-tribromoacetylbenzene, 4-dibromoacetylbenzoic acid, 1,4-bis-dibromomethylbenzene, tris-dibromomethyl-s-triazine, 2-(6-methoxynaphth-2-yl)-, 2-(naphth-1-yl)-, 2-(naphth-2-yl)-, 2-(4-thoxy ethylnaphth-1-yl)-, 2-(benzopyran-3-yl)-, 2-(4-methoxyantrac-1-yl)-, 2-(4-styrylphenyl)-, 2-(phenanthr-9-yl)-4,6-bistricloro-methyl-s-triazine, and the compounds listed in the following examples.

The amount of initiator can likewise vary widely according to its chemical nature and the composition of the layer. Favorable results are obtained with from about 0.1 to 10 percent by weight, preferably from about 0.2 to 5 percent by weight, based on the total solids. Particularly for copying layers over 0.01 mm in thickness, it is advisable to use relatively less acid donor.

The light-sensitive layer can also contain soluble or even finely-divided, dispersible dyes and, depending on the intended use, UV absorbers. Suitable dyes include the triphenylmethane dyes, especially in the form of their carbinol bases. The most favorable mixing ratios of the components can easily be determined in the individual case by means of preliminary experiments.

The thickness of the outer radiation or light-sensitive layer depends fundamentally on the intended use of the material. The layer thickness can generally range between about 500 nm and 0.08 mm, preferably between about 0.001 and 0.05 mm. The preferred layer thicknesses used for printing plates and photoresist layers applied from solutions are in the range from about 0.001 to 0.01 mm.

The outer light-sensitive layer can basically be applied from the same solvents as used for the quinone diazide layer. It is surprising that a deterioration of the stabilizing action of the intermediate layer then does not occur, although it has to be expected that the intermediate layer is partially dissolved by the solvent of the second coating solution such that the intermediate layer's constituents are mixed with the lower portions of the outer light-sensitive layer. Obviously, a continuous, very thin quinone diazide layer that is sufficiently thick to attain the stabilizing action desired according to the present invention is, in any case, maintained directly on the support.

Suitable support materials for the light-sensitive mixtures are all materials customarily used in the art in copying processes. Examples which may be mentioned are plastic films, insulating boards with copper layer, mechanically or electrochemically grained and optionally anodized aluminum, screen-printing stencil supports, wood, ceramics, glass, and silicon with a surface which can have been chemically converted, for example, into silicon nitride or silicon dioxide.

Preferred support materials for thick layers over 0.01 mm are plastic films, which then serve as temporary supports for transfer layers. For this purpose and for color proofing films, preference is given to polyester films, such as polyethylene terephthalate. Polyolefin films like polypropylene are also suitable. The support materials used for layer thicknesses below about 0.01 mm are usually metals. In the case of offset printing plates it is possible to use mechanically or chemically grained and optionally anodized aluminum. The aluminum can, in addition, have been chemically pretreated, for example, with polyvinylphosphonic acid, silicates or phosphates.

Coating can be effected directly or by layer transfer from temporary supports onto circuit board materials that comprise insulating boards with a copper layer on one or both sides, onto glass or ceramic materials that may have been given an adhesion-promoting pretreatment, and onto silicon wafers.

For the drying after coating the customary equipment and conditions can be used. Temperatures around 100° C. and briefly up to 120° C. can be withstood without loss of radiation sensitivity.

Exposure can be effected with the customary light sources such as fluorescent lamps, xenon pulsed lamps, metal halide doped mercury vapor high-pressure lamps, and carbon arc lamps.

It is advantageous to use laser irradiators, in particular automatic processing systems, which contain as the source of radiation an argon ion laser. Irradiation can also be effected with electron beams. In this case, acid-forming compounds which, in the customary sense, are not light-sensitive can be used as initiators of the solubilizing reaction. Examples of such compounds are halogenated aromatic compounds or halogenated polymeric hydrocarbons. X-rays or ion rays can likewise be used for image generation.

The imagewise exposed or irradiated layer can be removed in a conventional manner with the developers known for use with commercially available naphthoquinonediazide layers and photoresists. The copying behavior of the new materials of the present invention can be adapted advantageously to known auxiliaries, such as developers and programmed spray development apparatus. The aqueous developer solutions can contain, for example, alkali metal phosphates, silicates, borates or hydroxides, as well as wetting agents and, if desired, minor amounts of organic solvents. In certain cases even solvent-water mixtures are usable as a developer. The choice of the most favorable developer can be determined by experiments on the particular layer used. If necessary, the development can also be aided mechanically.

In the case of using materials prepared according to the present invention as printing plates, the developed plates can be briefly heated to elevated temperatures to increase their durability in printing and the resistance to wash-out agents, correcting agents and UV-curable printing inks, as known for diazo layers from British Patent No. 1,154,749.

Below, examples of preferred embodiments of the recording material of the present invention are given for the purpose of illustrating the present invention without being limitative. In the examples parts by weight (p.b.w.) and parts by volume (p.b.v.) are in the ratio of g/cm$^3$; percentages and quantitative ratios are to be understood in weight units, unless otherwise specified.

EXAMPLE 1

This example shows the influence of the thickness of the intermediate layer on the light-sensitivity and the storage stability of the recording material according to the present invention.

Aluminum plates which had been electrolytically grained in hydrochloric acid and then anodized in sulfuric acid and hydrophilized with polyvinyl phosphonic acid were spin-coated with the following solution:

6.6 p.b.w. of a cresol-formaldehyde novolak (melting point according to the capillary method DIN 53 181: 105°–120° C.) and 1.6 p.b.w. of the trisester obtained from 1,2-naphthoquinone-2-diazide-5-sulfonyl chloride and 2,3,4-trihydroxybenzophenone in 82.0 p.b.w. of tetrahydrofuran, 65.6 p.b.w. of 2-methoxyethanol and 16.4 p.b.w. of butyl acetate.

By varying the spinning rate, different layer thicknesses were obtained on the aluminum plates (see Table 1). The layers were dried for 2 minutes at 100° C. in a circulating air drying oven. A layer containing 4.7 p.b.w. of novolak (see above)

1.4 p.b.w. of polyacetal obtained from 2-ethylbutyraldehyde and triethylene glycol, 0.23 p.b.w. of 2-(4-styrylphenyl)-4,6-bis trichloromethyl-s-triazine and 0.02 p.b.w. of crystal violet base in 93.65 p.w.b. of butanone was then applied by spin-coating. This layer had a thickness of 1,500 nm. After drying as described above, a 5 kW metal halide lamp arranged at a distance of 110 cm was used to expose the plates for 10 seconds through a continuous-tone step wedge provided with 13 steps having density increments of 0.15 (exposure wedge "BK01" of Hoechst AG, Werk Kalle) and after a delay of 10 minutes, the plates were developed for 30 seconds in a developer composed of:

8.5 p.b.w. of $Na_2SiO_3 \times 9H_2O$, 0.8 p.b.w. of NaOH and 1.5 p.b.w. of $Na_2B_4O_7 \times 10H_2O$ in 89.2 p.b.w. of $H_2O$ The plates were then inked with a greasy black printing ink and the first step of the continuous-tone step wedge, which completely accepted ink, was determined. After plate production, some plates were stored for four hours in a steam-saturated atmosphere at 80° C. and were then processed as described above. The results obtained are compiled in the following table.

TABLE 1

| thickness of the intermediate layer (nm) | first solid step in the continuous-tone step wedge | change of the continuous-tone step wedge after 4 hours storage under severe conditions (in whole steps) |
|---|---|---|
| 0 | 9 | 2 |
| 100 | 8 | 0 |
| 200 | 8 | 0 |
| 400 | 8 | 0 |
| 600 | 8 | 0 |
| 1000 | 7 | 0 |
| 1500 | 7 | 0 |

EXAMPLE 2

This example demonstrates the suitability of the recording material according to the present invention for use with different support materials.

Two layers as in Example 1 were spin-coated onto different support materials. The thickness of the intermediate layer was adjusted to a uniform value of 200 nm. Exposure and development were carried out as described in Example 1.

Support No. 1: aluminum plate which had been electrolytically grained in nitric acid, anodized in sulfuric acid and hydrophilized with polyvinyl phosphonic acid;

Support No. 2: corresponding to Support No. 1, except that there was no treatment in polyvinyl phosphonic acid;

Support No. 3: corresponding to Support No. 1, except that it was hydrophilized by means of a $Na_2SiO_3$ solution;

Support No. 4: aluminum plate which had been mechanically grained with an abrasive suspension and hydrophilized with polyvinyl phosphonic acid;

Support No. 5: copper plate mechanically grained by brushing;

Support No. 6: mechanically grained zinc plate;

Support No. 7: silicon wafer covered with a $SiO_2$ film;

Support No. 8: polyester film treated with polyvinyl alcohol and silica sol.

TABLE 2

| Support No. | intermediate layer | first solid step in the continuous-tone step wedge | change of the continuous-step wedge after 4 hours storage under severe conditions |
|---|---|---|---|
| 1 | no | 9 | 2 |
| 1 | yes | 8 | 0 |
| 2 | no | 9 | 2 |
| 2 | yes | 8 | 0 |
| 3 | no | 9 | 2 |
| 3 | yes | 8 | 0 |
| 4 | no | 9 | 2 |
| 4 | yes | 8 | 0 |
| 5 | no | 9 | 2 |
| 5 | yes | 8 | 0 |
| 6 | no | 9 | 2 |
| 6 | yes | 8 | 0 |
| 7 | no | 9 | 2 |
| 7 | yes | 8 | 0 |
| 8 | no | 4 | 1 |
| 8 | yes | 3 | 0 |

EXAMPLE 3

This example demonstrates the suitability of the recording material according to the present invention for the production of lithographic printing plates.

An aluminum plate which had been electrolytically grained in nitric acid, anodized in sulfuric acid and hydrophilized with polyvinyl phosphonic acid was spin-coated with the following solution:

6.6 p.b.w. of novolak as in Example 1, 1.6 p.b.w. of naphthoquinone diazide as in Example 1 and 0.02 p.b.w. of crystal violet base in 82.0 p.b.w. of tetrahydrofuran, 65.6 p.b.w. of 2-methoxy-ethanol and 16.4 p.b.w. of butyl acetate.

The layer was dried for 2 minutes in a circulating air drying oven at 100° C. A layer thickness of 200 nm was obtained. Then a second layer was applied by spin-coating. This layer contained:

4.0 p.b.w. of novolak as in Example 1, 1.2 p.b.w. of a polymeric orthoester obtained from 4-oxa-6,6-bis-hydroxymethyl octan-1-ol and triethyl orthoformate, 0.20 p.b.w. of 2-(4-styrylphenyl)-4,6-bis trichloromethyl-s-triazine and 0.02 p.b.w. of crystal violet base in 94.60 p.b.w. of butanone.

A layer thickness of 2,000 nm was obtained. The plate was exposed imagewise for 10 seconds, using a 5 kW metal halide lamp arranged at a distance of 110 cm. It was then heated for 1 minute at 80° C. and developed for 1 minute in the developer used in Example 1. The offset printing plate so produced printed 100,000 copies having an impeccable quality.

EXAMPLE 4

This example demonstrates the suitability of the recording material according to the present invention for image generation by means of electron beams.

A 100 nm thick intermediate layer having the composition specified in Example 1 was applied to mechanically grained aluminum. On top of this intermediate layer, a solution of the following compositions was spincoated:
4.0 p.b.w. of novolak as in Example 1,
1.2 p.b.w. of the bis-(5-butyl-5-ethyl-1,3 dioxan-2-yl)-ether of 2-butyl-2 ethyl-propanediol,
0.2 p.b.w. of 2-(4-ethoxy-naphth-1-yl)-4,6-bis trichloromethyl-s-triazine and
0.02 p.b.w. of crystal violet base in
94.6 p.b.w. of butanone.

A layer thickness of 1,000 nm was obtained. The material was irradiated with 11 kV electrons. Using a beam current of $5.10^{-6}$ A, a radiation time of 4 seconds was sufficient to render a 10 cm$^2$ area soluble, after the developer of Example 1 had been allowed to act for 90 seconds. This corresponds to a sensitivity of the above-described layers of $2.10^{-6}$ C/cm$^2$.

EXAMPLE 5

This example demonstrates the suitability of the recording material according to the present invention for use as an etch resist.

A copper plate was coated with a 200 nm thick intermediate layer as in Example 1. On top of this intermediate layer the following solution was applied by spincoating:
40 p.b.w. of novolak as in Example 1,
11.7 p.b.w. of a polyacetal obtained from triethyleneglycol and butyraldehyde,
0.5 p.b.w. of 2-(4-ethoxy-naphth-1-yl)-4,6-bis trichloromethyl-s-triazine and
0.1 p.b.w. of crystal violet base in
50.0 p.b.w. of ethanol and
60.0 p.b.w. of butanone.

After drying for 10 minutes at 100° C., a layer thickness of 0.025 mm resulted. The plate was exposed for about 50 seconds to the light of a 5 kW metal halide lamp (distance 110 cm) and after a delay of 15 minutes, development was carried out for 90 seconds using the developer specified in Example 1. The resist stencil thus obtained exhibited an excellent resistance in the etching and electroplating procedures, in particular in the electrodeposition of copper and Pb/Sn-alloy.

EXAMPLE 6

This example demonstrates the suitability of the recording material according to the present invention for use as a high-resolution photoresist stencil.

An intermediate layer as specified in Example 1 was spin-coated onto a silicon wafer covered with a SiO$_2$-film to give a layer thickness of 200 nm. The coating solution had previously been filtered through a filter with a pore diameter of 200 nm (millipore). On top of this intermediate layer the following solution was spincoated, which had been filtered in the same manner:
12.5 p.b.w. of novolak as in Example 1,
2.1 p.b.w. of polyacetal as in Example 1 and
0.1 p.b.w. of 2-(4-styrylphenyl)-4,6-bis trichloromethyl-s-triazine in
85.0 p.b.w. of 2-ethoxy-ethylacetate.

After drying for 1 minute at 100° C., a thickness of 1,000 nm was obtained. A test image mask was brought into intimate contact with the wafer, which was then exposed for 15 seconds to ultraviolet light at 365 nm, having an intensity of 4.5 mW/cm$^2$. Following a delay of 10 minutes, the wafer was developed for 45 seconds using the developer of Example 1. The image pattern obtained exhibited a resolution of 1,000 nm.

What is claimed is:

1. A positive-working radiation-sensitive recording material comprising:
   (a) a support;
   (b) a first radiation-sensitive layer consisting essentially of an admixture of a radiation-sensitive 1,2-quinone diazide in an amount to provide stabilizer action on a second radiation-sensitive layer, and a polymeric water-insoluble binder in an amount to provide film forming property to the first radiation-sensitive layer overlying said support; and
   (c) a second radiation-sensitive layer, thicker than said first layer and overlying said first layer, consisting essentially of in admixture:
   a compound which forms a strong acid under the action of actinic radiation selected from the group consisting of a diazonium, phosphonium, sulfonium and iodonium salts, halogen compounds and organometal-organohalogen combinations,
   a compound which has at least one acid-cleavable C—O—C bond, said acid-forming and acid-cleavable compound present in amounts sufficient to increase the solubility of portions of said second layer exposed to actinic radiation so that an image can be developed, and
   a polymeric binder in an amount sufficient to form a uniform layer
   said recording material having an improved storage stability.

2. A recording material as claimed in claim 1, wherein the quinone diazide layer has a thickness of 10 to 5,000 nm.

3. A recording material as claimed in claim 1, wherein the binder is soluble in aqueous-alkaline solutions.

4. A recording material as claimed in claim 1, wherein the 1,2-quinone diazide comprises a 1,2-naphthoquinone-2-diazide-sulfonic acid ester.

5. A recording material as claimed in claim 3, wherein the quinone diazide layer contains from 30 to 90 percent by weight of the binder and from 3 to 50 percent by weight of 1,2-quinone diazide.

6. A recording material as claimed in claim 1, wherein the polymeric binder is insoluble in water and soluble in aqueous-alkaline solutions.

7. A recording material as claimed in claim 1, wherein said acid-cleavable compound comprises at least one orthocarboxylic acid ester or carboxylic acid amide acetal grouping.

8. A recording material as claimed in claim 1, wherein the outer radiation-sensitive layer has a thickness in the range from 500 nm to 0.08 mm.

9. A recording material as claimed in claim 1, wherein the outer radiation-sensitive layer comprises from 30 to 90 percent by weight of polymeric binder, from 5 to 70 percent by weight of acid-cleavable compound and from 0.1 to 10 percent by weight of the compound which forms an acid under the action of radiation.

10. A recording material as claimed in claim 1, wherein said acid-cleavable compound comprises oligomer or polymer compounds having recurrent acetal or ketal groupings in the main chain.

11. A recording material as claimed in claim 1, wherein said acid-cleavable compound comprises compounds having at least one enolic ether or acyl-iminocarbonate grouping.

12. A positive-working radiation-sensitive recording material as claimed in claim 1, consisting essentially of (a), (b) and (c).

* * * * *